(12) United States Patent
Cantave et al.

(10) Patent No.: US 8,456,160 B2
(45) Date of Patent: Jun. 4, 2013

(54) THREE AXIS FIELD MONITOR

(75) Inventors: Guilford Louis Cantave, Orlando, FL (US); Larry Neil Purvis, Orlando, FL (US); Mark Jeffery Green, Winter Springs, FL (US)

(73) Assignee: Sypris Test & Measurement, Orlando, FL (US)

( * ) Notice: Subject to any disclaimer, the term of this patent is extended or adjusted under 35 U.S.C. 154(b) by 335 days.

(21) Appl. No.: 12/462,498

(22) Filed: Aug. 4, 2009

(65) Prior Publication Data

US 2011/0031968 A1 Feb. 10, 2011

(51) Int. Cl.
*G01R 33/00* (2006.01)

(52) U.S. Cl.
USPC ............. 324/260; 702/85; 702/87; 324/202; 324/252

(58) Field of Classification Search
USPC .................. 324/202, 260, 252; 702/85–87
See application file for complete search history.

(56) References Cited

U.S. PATENT DOCUMENTS

| | | | |
|---|---|---|---|
| 5,629,622 A * | 5/1997 | Scampini | 324/247 |
| 5,966,676 A * | 10/1999 | Fujiwara et al. | 702/85 |
| 6,032,109 A * | 2/2000 | Ritmiller, III | 702/104 |
| 2005/0200365 A1* | 9/2005 | Bradley et al. | 324/601 |
| 2008/0012553 A1* | 1/2008 | Shalgi et al. | 324/207.17 |
| 2010/0007338 A1* | 1/2010 | Schultz | 324/202 |

* cited by examiner

*Primary Examiner* — Arleen M Vazquez
(74) *Attorney, Agent, or Firm* — Kelley Drye & Warren LLP

(57) ABSTRACT

The gauss meter devices of the present invention are small, low power 3 axis field monitor board which detects DC to slow varying magnetic fields. The unit is designed to be embedded into a system which may be sensitive to magnetic fields and needs to continuously measure the magnitude of the field around it. The unit continuously monitors and logs magnetic fields on X, Y and Z axes and it also logs the vector summation of the X, Y and Z axes. The unit may be controlled and queried by wired serial communication means or by means of an integrated radio frequency (RF) transceiver. The RF transceiver may utilize a proprietary communication protocol or a standard wireless communication protocol such as ZigBee, Bluetooth or any of the IEEE communications standards. The many configuration settings of the device may be changed by the user by issuing commands to the device from an established command set. Novel use is made of solid state electronics to calibrate the unit digitally instead of by the traditional use of mechanical potentiometers, physical trimming of resistors and so forth. Therefore, the units may be calibrated by an automated system. All calibration and configuration data is stored in nonvolatile memory.

8 Claims, 12 Drawing Sheets

Fig. 5

System Commands

| Command | Function |
|---|---|
|  | Data Logging |
| 0 | Continuous Field Measurement: On (500ms update rate) |
| 1 | Continuous Field Measurement: Off |
| 2 | Output Sampled Data: On |
| 3 | Output Sampled Data: Off |
| 4 | Get all logged data from memory |
| 5 | Get all logged X data from memory |
| 6 | Get all logged Y data from memory |
| 7 | Get all logged Z data from memory |
| 8 | Get all logged VS data from memory |
| 9 | Break (get logged data) |
| 10 | Clear all logged data in memory |
| 11 | Log data while in Continuous Field Measurement mode: On |
| 12 | Log data while in Continuous Field Measurement mode: Off |
| 13 | Log data while polling Field Measurements: On |
| 14 | Log data while polling Field Measurements: Off |
| 15 | Get number of stored loggings |
|  |  |
|  | Field Measurements |
| 16 | Get current X |
| 17 | Get current Y |
| 18 | Get current Z |
| 19 | Get current Vector Sum |
| 20 | Get current X, Y, Z and Vector Sum |
| 21 | Get current session X, Y, Z and Vector Sum maximums |
| 22 | Get previous session X, Y, Z and Vector Sum maximums |
| 23 | Get lifetime X, Y, Z and Vector Sum maximums |
| 24 | Clear lifetime X, Y, Z and Vector Sum maximums |
|  |  |
|  | Human Visual Interface |
| 25 | Human Visual Interface: On (Additional text is displayed to Hyper Terminal) |
| 26 | Human Visual Interface: Off |
| 27 | Automatic Clear Screen (Hyper Terminal): On |
| 28 | Automatic Clear Screen (Hyper Terminal): Off |
|  |  |
|  | UART Control |
| 35 | UART Baud rate: 9.6kbps |
| 36 | UART Baud rate: 19.2kbps |

Fig. 5 Continued

| 37 | UART Baud rate: 57.6kbps |
|---|---|
| 38 | UART Baud rate: 115.2kbps |
|  |  |
|  | Data Logging Rate |
| 40 | Set log update rate: 0.5s |
| 41 | Set log update rate: 1s |
| 42 | Set log update rate: 5s |
| 43 | Set log update rate: 10s |
| 44 | Set log update rate: 15s |
| 45 | Set log update rate: 30s |
| 46 | Set log update rate: 60s |
|  |  |
|  | Logged Data Retrieval Throughput |
| 47 | Get all logged data speed: High |
| 48 | Get all logged data speed: Low |
|  |  |
|  | Setting Restoration |
| 60 | Load default settings |
|  |  |
|  | General |
| 90 | Get firmware version |
| 91 | Get serial number |
| 92 | Get model number |
| 93 | Display Settings |
| 94 | Clear screen |
|  |  |
|  | Sleep Mode |
| 99 | Enter sleep mode (Awake upon receiving first UART reception) |

THREE AXIS FIELD MONITOR

FIELD OF THE INVENTION

The invention relates to devices and methods of detecting magnetic fields more particularly to embedded devices for detecting and measuring magnetic fields within electronic instruments, especially medical instruments.

BACKGROUND OF THE INVENTION

Magnetic field strength detectors have been used in various industries to detect the presence of spurious, unwanted and even sometimes dangerous levels of magnetic fields. In many instances the magnetic field strength detector provided information or warning to protect against excessive exposure of films, tapes, magnetic disks to magnetic fields.

U.S. Pat. No. 3,604,373 describes a storage cabinet system in which magnetic field strength detectors were placed within the cabinet to signal an excessive level of magnetism by audio and visual alarms.

U.S. Pat. No. 7,068,030 describes a magnetic field strength detector that may be used to measure the strength of a magnetic field generated by a degaussing device, or to confirm that a particular medium was exposed to a magnetic field with strength adequate to degauss the medium.

Magnetic field strength detectors have been used to detect excessive magnetic fields that could damage sensitive medical equipment. U.S. Pat. No. 4,954,812 describes a stand-alone device for use in preventing accidental exposure of magnetically sensitive equipment to large magnetic fields produced by Magnetic Resonance Imagining devices. This patent describes a device designed to be externally mounted onto a vertical stand, using a vise grip arrangement, which supports magnetically sensitive equipment. Three Hall sensors are arranged in a horizontal plane with an angle of 120 degrees between each sensor. Mechanical potentiometers are used for calibration at the site of the end-user. U.S. Pat. No. 4,95,4812 describes the use of absolute value circuitry in the signal paths of the Hall sensors. The devices described in the patent have audible alarms as well as light emitting diode (LED) bar graph displays for a dynamic visual indication of the magnitude of the magnetic field being detected. The devices are powered by two 9V batteries connected in series to develop a bipolar supply of ±9V.

Therefore, there is a need in the industry for a device to assist manufacturers of instruments that are sensitive to magnetic fields, especially OEM medical equipment manufacturers, to identify and troubleshoot equipment anomalies by recording the magnetic field to which a particular instrument or medical equipment was exposed where the detection device is integral to the sensitive instrument.

SUMMARY OF THE INVENTION

The devices of the present invention can measure ambient magnetic fields in and around any given instrument. The devices of the present invention may transfer this data to a given host device, in which the device of the present invention can be embedded. This information can be made available on demand and optionally logged. The devices of the present invention can be a self contained unit that can be easily integrated into various medical equipment designs with minimal modifications. The devices of the present invention comprise three orthogonally positioned Hall Generators with a vector summation capability to accurately measure and record the magnetic field within the OEM's portable equipment cabinet. In preferred embodiments the devices of the present invention are compatible with the host equipment and need not be modified prior to integration within the host device. The three axis measurements made by the device of the present invention are not limited to low fields as is the case with most field monitors. The devices of the present invention are capable of measuring magnetic field magnitude to tens of kilo Gauss. Unlike prior art devices the invention does not have a display and is not a bench top or hand held device, In preferred embodiments the devices of the present invention are designed to be embedded into a host device such as a medical instrument. The invention is also equipped with virtually unlimited endurance, nonvolatile data logging capabilities which is not typical for most devices of this type. The devices of the present invention also allow for the OEM to determine the time interval that the device will store this data.

The measurement devices of the present invention are small, low power 3 axis field monitor boards which detect DC to slow varying magnetic fields. The unit is designed to be embedded into a system which may be sensitive to magnetic fields and needs to continuously measure the magnitude of the field surrounding it. The unit can continuously monitor and log magnetic fields on X, Y and/or Z axes and it can also log the vector summation of the X, Y and Z axes. The device may be controlled and queried by wired serial communication means or by means of an integrated radio frequency (RF) transceiver. The RF transceiver may utilize a proprietary communication protocol or a standard wireless communication protocol such as ZigBee, Bluetooth or any of the IEEE communications standards. The many configuration settings of the device may be changed by the user. This may be accomplished by issuing commands to the device from an established command set. Novel use is made of solid state electronics to calibrate the device digitally instead of by the traditional use of mechanical potentiometers, physical trimming of resistors and other means. The use of solid state electronics enables the device to be calibrated by an automated system. Calibration and configuration data may be stored in nonvolatile memory.

The devices of the present invention include detectors where the Hall sensor orientation is one on each of the X, Y and Z axes in a Cartesian coordinate system. This enables the devices to not only measure the X, Y and Z components of the measured field but also to measure the vector summation of the magnitude of a magnetic field from a direction in three dimensional space which is not perpendicular to any of the three axes and therefore not limited to a single plane. The devices of the present invention use digital processors for signal processing to perform all core functions. This enables the devices to add functionality in the form of modified firmware instead of modified/added circuitry. The devices of the present invention do not use mechanical potentiometers thus increasing system reliability by eliminating components that can degrade with time and use. Calibration shifts due to shock and vibration are also eliminated. The devices of the present invention can be calibrated manually or by an automated system. The devices of the present invention also have the ability to detect the polarity/direction of the measured field which may be useful in certain circumstances. The devices of the present invention can utilize the power source of the host instrument thereby avoiding periodic battery replacement. The devices can also use the host instrument to dictate necessary action in response to the precise measurement information acquired by the devices of the present invention.

The magnetic field measuring instruments of the present invention can be mounted internally, externally, and in any orientation on any instrument. Methods of mounting may include adhesives and/or hardware such as screws, bolts, standoffs, or spacers. The host device provides an operating environment which is within that specified for the given embodiment of the invention. This would include parameters such as, but not limited to a power supply voltage, temperature and humidity, compatible communications bus and proximity to any component which produces its own high magnetic field such as a solenoid or motor, which could produce erroneous readings. Obviously the device should be installed in such a manner that prevents shorting of exposed electrical components on the invention, or mechanical damage.

BRIEF DESCRIPTION OF THE DRAWINGS

FIG. 5 is a table of the standard system commands which may be used to operate the unit.

DETAILED DESCRIPTION OF THE INVENTION

Figure 1:
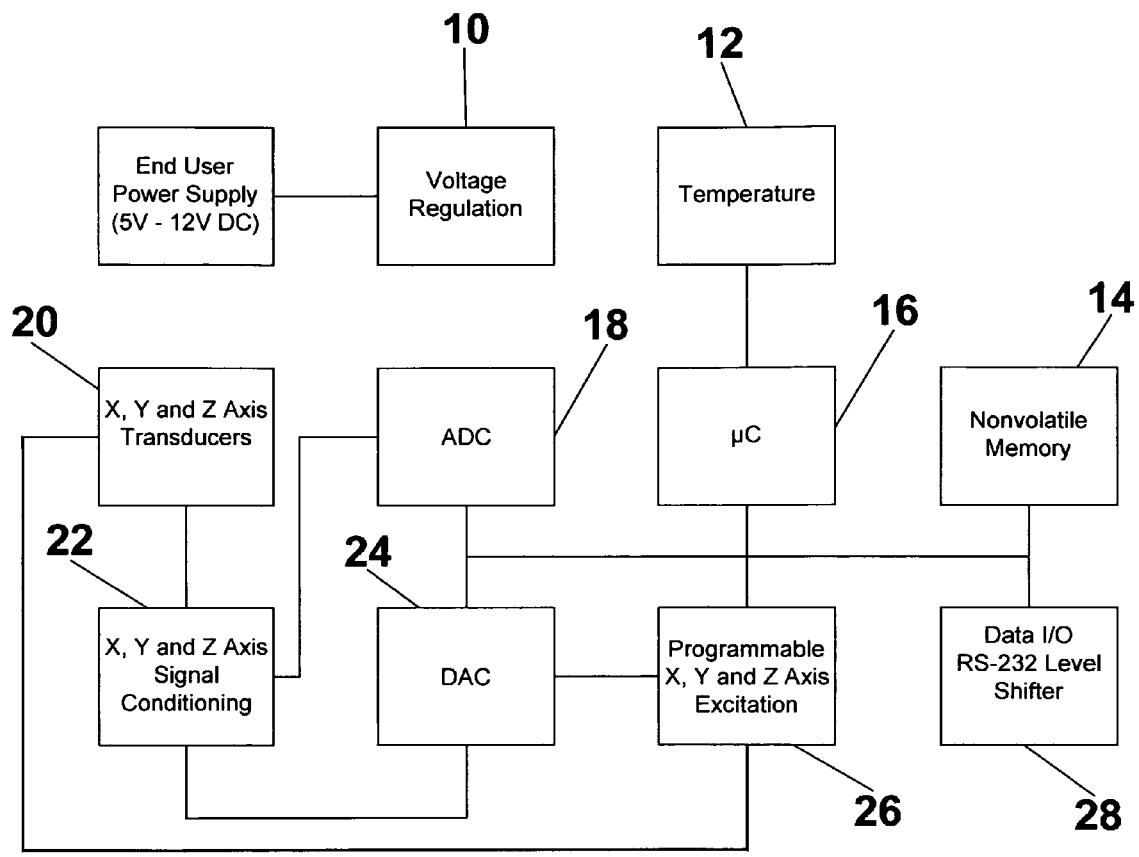
FIG. 1 is a high level system block diagram of one embodiment of the invention.
Figure 2:
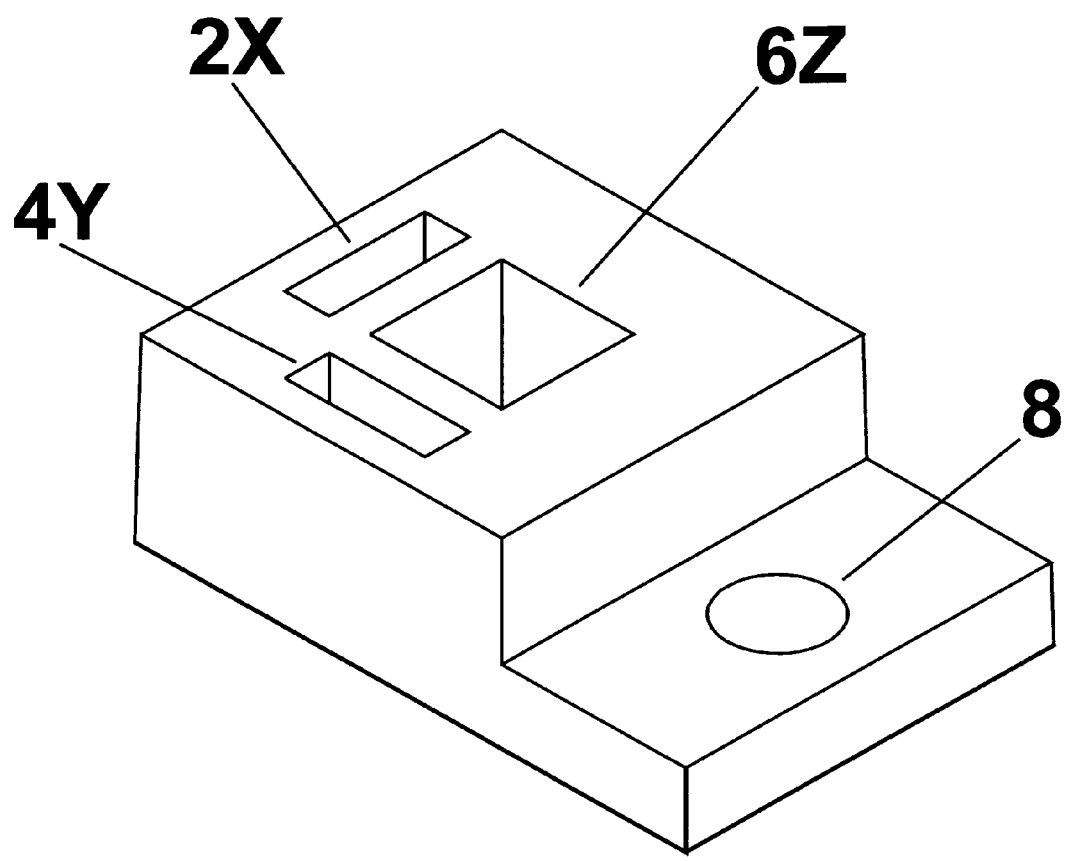
FIG. 2 is a schematic of a three-dimensional view of the X axis and Y axis orthogonal Hall sensor aligner.
Figure 3:
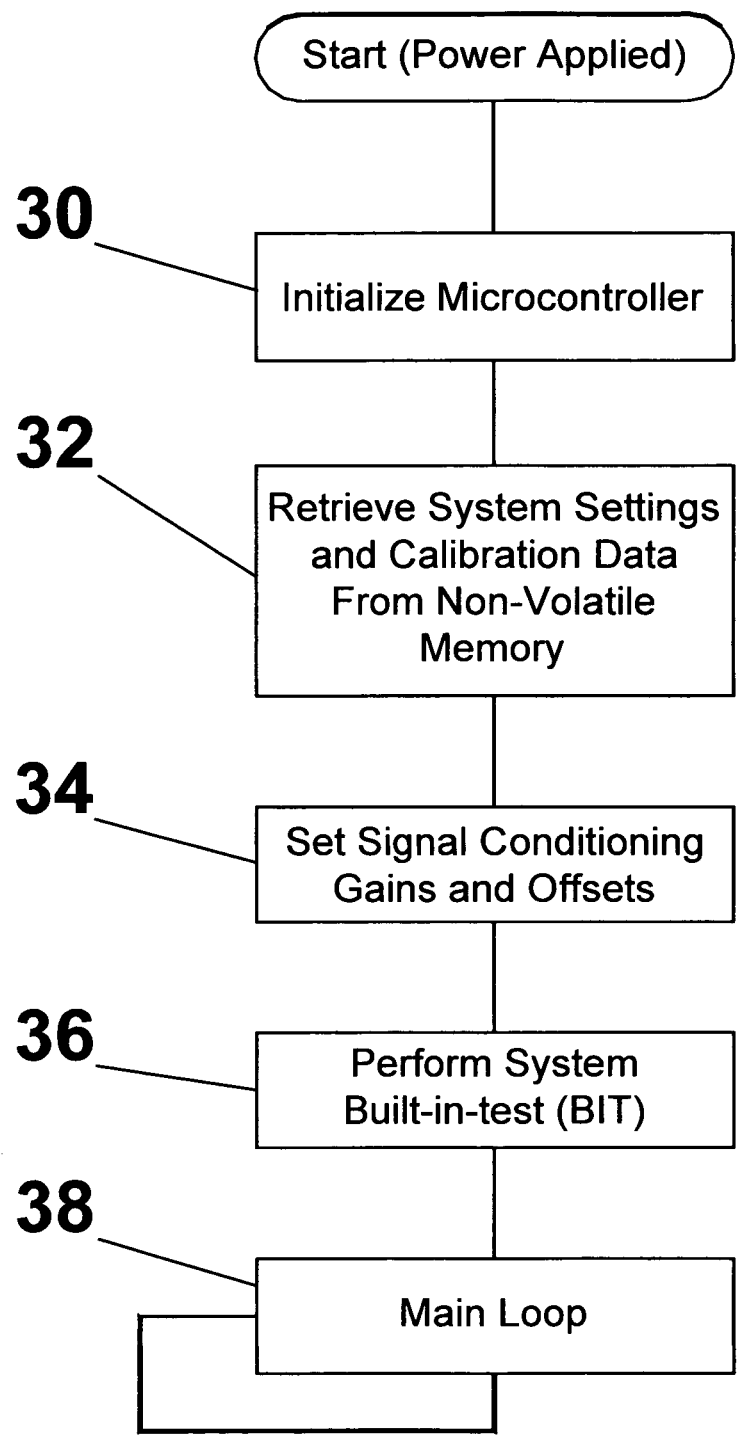
FIG. 3 is a block diagram of the basic firmware flow for one embodiment of the invention.

The devices of the present invention can measure the ambient magnetic field in and around any given instrument. The devices of the present invention may transfer this data to a given host device, in which the device of the present invention can be embedded. This information can be made available on demand and optionally logged. The devices of the present invention can be a self contained unit that can be easily integrated into various medical equipment designs with minimal modifications The devices of the present invention may be comprised of a variety of elements arranged in different combinations depending on the use of the device. Such elements that may be included in the devices of the present invention include but are not limited to voltage regulators, microcontrollers, non-volatile memory, analog to digital converters, Hall sensors, instrumentation amplifiers and operational amplifiers.

Voltage regulators 80 and 110 maintain a fixed operating voltage of 3.3V which is used for all of the analog and digital electronics onboard to operate correctly.

Microcontroller 102 controls all intelligent functions of the device. All of the major integrated circuits onboard are designed to be controlled by and interfaced to a processor/microcontroller.

Nonvolatile memory 66 is used for all data logging functions, calibration coefficients storage, user setting storage, factory setting storage and other functions.

Analog to digital converter (ADC) 114 is used to convert the signal conditioned output from all three of the Hall sensors into digital words which microcontroller 102 can digitally process.

The X axis Hall sensor, Hall sensor 40, as well as the Hall sensors in the Y and Z axes (which are not illustrated in the figures) detect the strength of incident magnetic fields and generate a proportional electrical voltage signal. The Hall sensors are the preferred embodiment however other types of magnetic transducers may be used.

The X axis instrumentation amplifier (IA), IA 48, as well as the Y and Z axis IAs (also not illustrated in the figures) may be used to amplify the electrical signals generated by the Hall generator transducers. IAs are a preferred embodiment for amplification due to their very low DC offset, low drift, low noise, very high open-loop gain, very high common-mode rejection ratio, and very high input impedances, but other amplification methods may be used.

The X axis constant current source operational amplifier (Op-Amp) circuitry, Op-Amp 32, as well as the Y and Z axis constant current source operational amplifier circuitry (not illustrated in the figures) may be used as an excitation source for the Hall sensors to ensure the accuracy and integrity of the Hall sensor output signals.

Other elements of the devices of the present invention may include but are not limited to resistors, integrated circuits, inline package switch, temperature sensors and digital to analog converters.

Resistors 68 through 78 may be used as voltage divider networks at ADC inputs for measuring the voltage at various rails and is used for built-in self-test.

Integrated circuit (IC) 52 is used to provide voltage level shifting to the communication input/output (IO) lines. Some host systems may use 3V signaling while others utilize ±5V minimum signaling. IC 52 allows the preferred embodiment to be compatible with both types of voltage signaling. The devices may also be fixed at 3V signaling and the voltage level shifting accomplished off board by the end-user.

Dual inline package (DIP) switch 58 may be used in conjunction with IC 52. It consists of four single-pole single-throw switches. When configured correctly, the communications port is either in the 3V signaling mode or in the ±5V mode. Jumpers or a pair of fixed resistors may also be used in place of the switch.

Digital temperature sensor 64 may be used in environments where the temperature may vary far outside the temperature range at which the device was calibrated. The temperature sensor is used to correct the errors which would have otherwise resulted. The measured temperature may also be accessed by the end-user at any time.

Digital to analog converter (DAC) 112 may be used to adjust/set the sensitivity/gain and offset of each of the individual X, Y and Z channels. DAC 112 is also used to reduce manufacturing time/cost by allowing the two mentioned parameters to be calibrated quickly by an automated system instead of using manual labor to adjust mechanical potentiometers or the use of the iterative process of placing and removing of fixed select resistors until a desired value is found.

Preferred embodiments of the three axis field-monitor electrical circuit details are displayed in FIGS. 4A through 4G. The details describing the analog front end apply to all three axes. Therefore, the following description for a single dimension may apply for all axes. The three axis field-monitor of the present invention uses three orthogonally positioned Hall sensors to detect magnetic fields. Digital to analog converter 112 along with operational amplifier 32 and the resistor 39 form the constant current source used for excitation current for Hall sensor 40.

The constant current source scheme may be implemented in a variety of ways. Integrated solutions exist which minimize the number of components required to realize the constant current function. A fixed single constant current source may be used in combination with software calibration correction factors for equalizing all three of the Hall sensor sensitivities. A fixed voltage design may be used in place of the constant current source. The preferred embodiments of the devices of the present invention are displayed in the figures.

The current that flows through the X axis Hall sensor is a function of the programmable voltage output from the digital to analog converter (DAC) 112 (VOUTA) which is applied to the non-inverting input of operational amplifier 32. The output of the DAC can be programmed from 0V to 2.50V which translates to 0A to 0.0035A of programmable excitation current to be passed through a Hall sensor. Each of the three Hall sensors used in the device may each have different levels of sensitivity, magnetic field input vs. Hall sensor output voltage, which requires each of the Hall sensors to use a different excitation current to all generate the same level of output when exposed to the same level of incident magnetic field. The arrangement of the circuitry described above provides control for the fine gain of the analog front end of the system digitally. Resistor 34 is used to keep the output of the X axis hall sensor maximally linear over a specified range. The devices of the present invention provide for the output to be linear within from about 0% about ±5%, over the expected range of the magnetic field levels. The devices of the present invention may include an alarm for an over limit indication.

When a magnetic field passes perpendicularly through a Hall sensor, a difference in potential will exist at the output which typically can range from a few microvolts to a few millivolts. This voltage/signal must be amplified before it can be processed. The output voltage of the X axis Hall sensor 40 is applied to the inputs of instrumentation amplifier 48 which amplifies the signal to a maximum of 2.50 V when the Hall sensor is exposed to the maximum expected magnetic field, which will maximize the use of the 2.50V input range of analog to digital converter 114 in FIG. 4C. Resistor 46 controls the coarse gain for the output of the X axis Hall sensor. Programmable signal voltage offset may be achieved by passing the voltage of one of the outputs of digital to analog converter 112 through analog control line 44. Resistor 42 and capacitor 43 are external components of the low pass filtering network of instrumentation amplifier 48. The output of instrumentation amplifier 48 is the fully signal conditioned signal which originated from the X axis Hall sensor. This signal along with the Y and Z axis signals are now applied to three of the input channels on analog to digital converter 114.

Figure 4A:
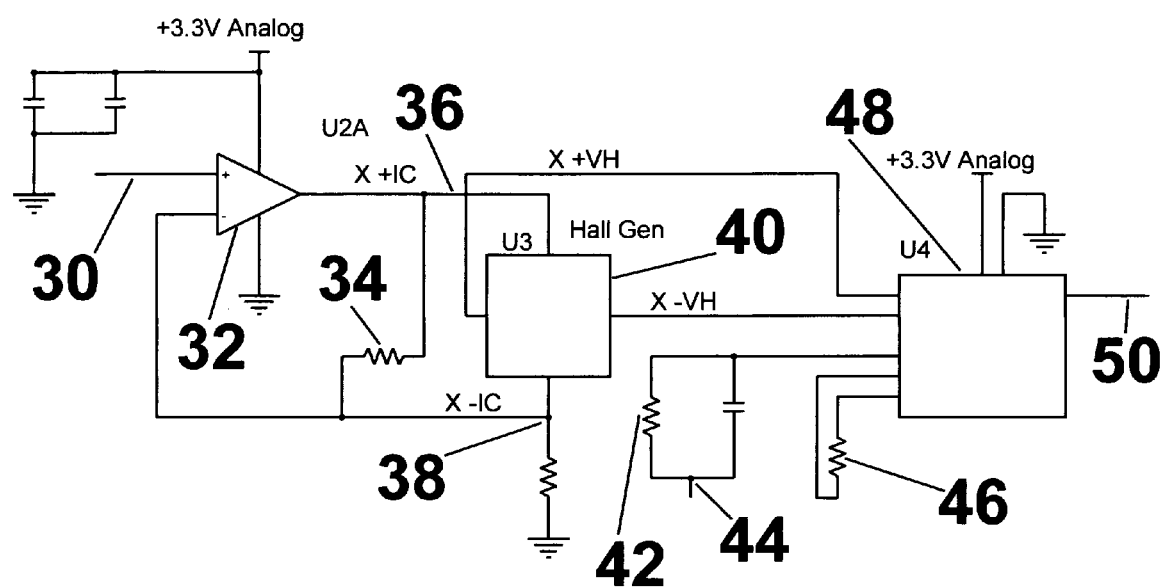
FIG. 4A is a schematic of the analog front end portion of one embodiment of the system of the invention.
Figure 4B:
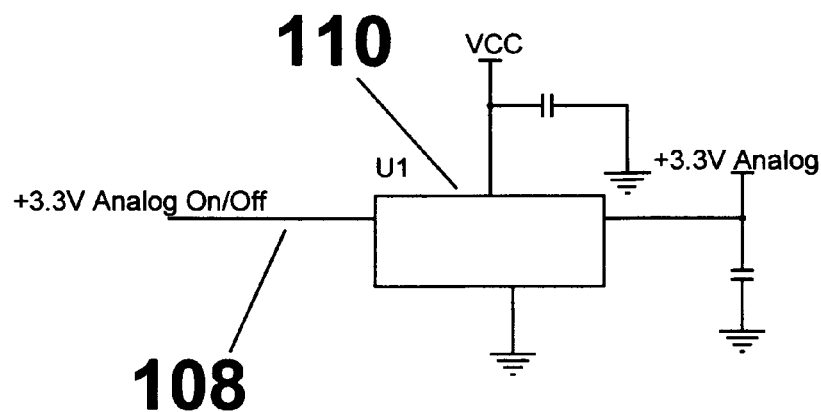
FIG. 4B is a schematic of the voltage regulator for the analog circuitry and also the multi-channel digital to analog converter for one embodiment of the invention.
Figure 4B:
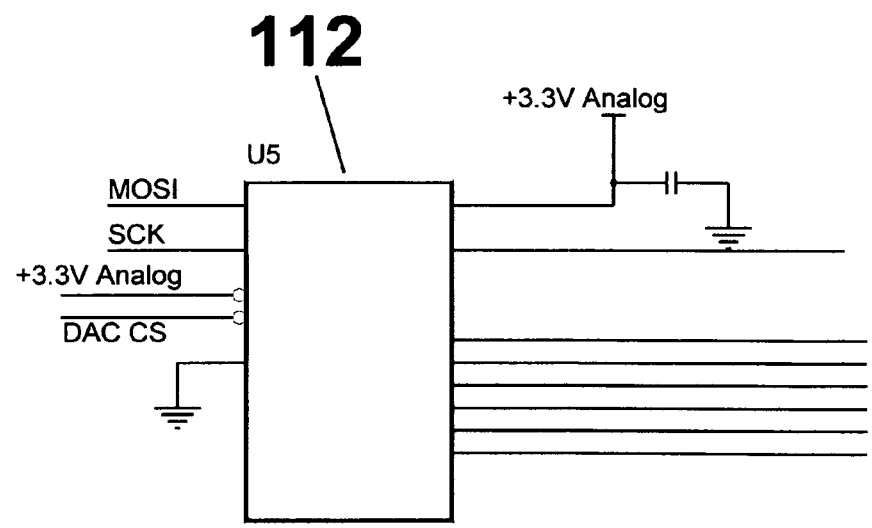
Figure 4C:
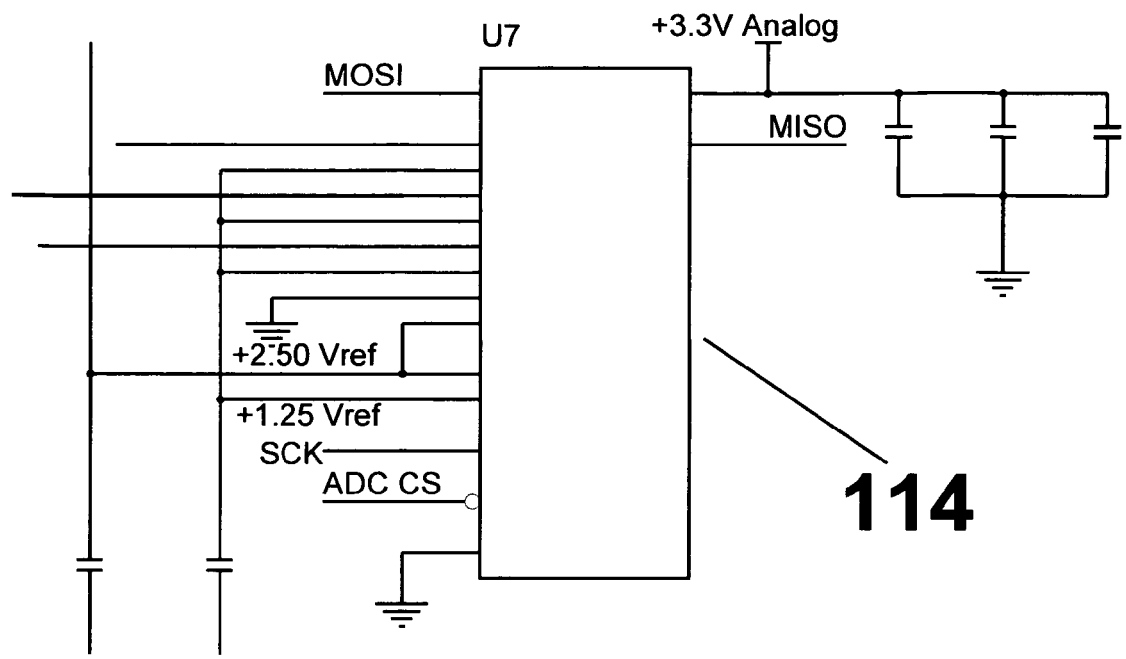
FIG. 4C is a schematic of the analog front end multi-channel analog to digital converter for one embodiment of the invention.
Figure 4D:
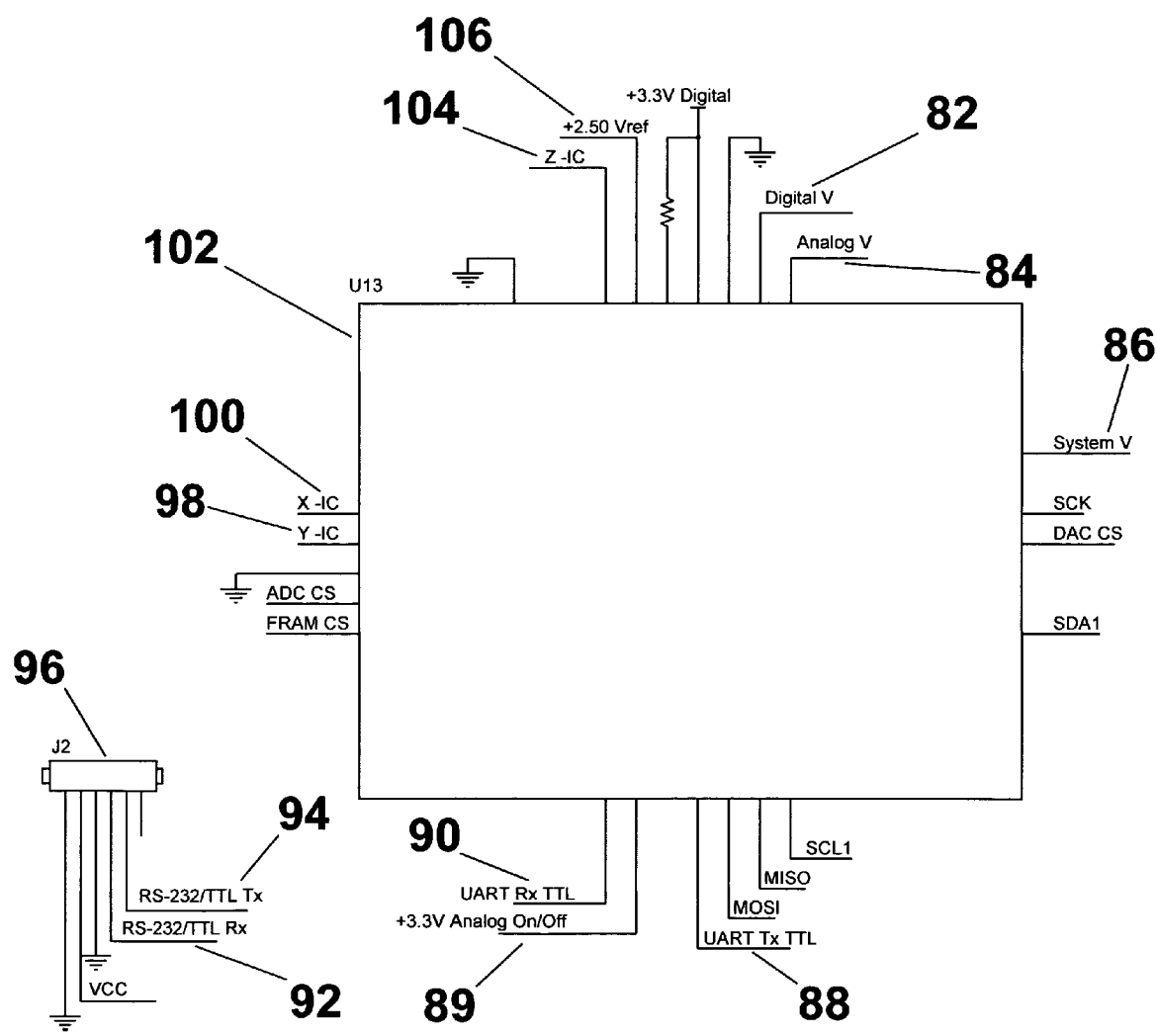
FIG. 4D is a schematic of the system controller for one embodiment of the invention.

Referring to FIG. 4D microcontroller 102 manages and coordinates many of the system functions. The functions that the microcontroller may manage include but are not limited to providing gain and offset control for each of the three axes, obtaining the sampled data from analog to digital converter 114 in FIG. 4C, storing data to and receiving data from non-volatile memory 66 in FIG. 4E, measuring the system supply voltage, measuring the voltage on the digital voltage supply rail, measuring the voltage on the analog voltage supply rail, measuring the ambient temperature and providing system data input/output.

In a preferred method of calibrating the devices of the present invention, the device is initially placed in a magnetically shielded enclosure. At this time, signal conditioning circuitries of the three axes are zeroed in a firmware controlled closed-loop operation. Microcontroller 102 serially transmits commands to the digital to analog converter 112 to increase or decrease the voltage output to analog control line 44, the X axis offset adjustment line, until the analog signal output on 50 is interpreted by analog to digital converter 114 as being zero. This process occurs in a similar fashion for the circuitries of the other two axes.

Figure 4E:
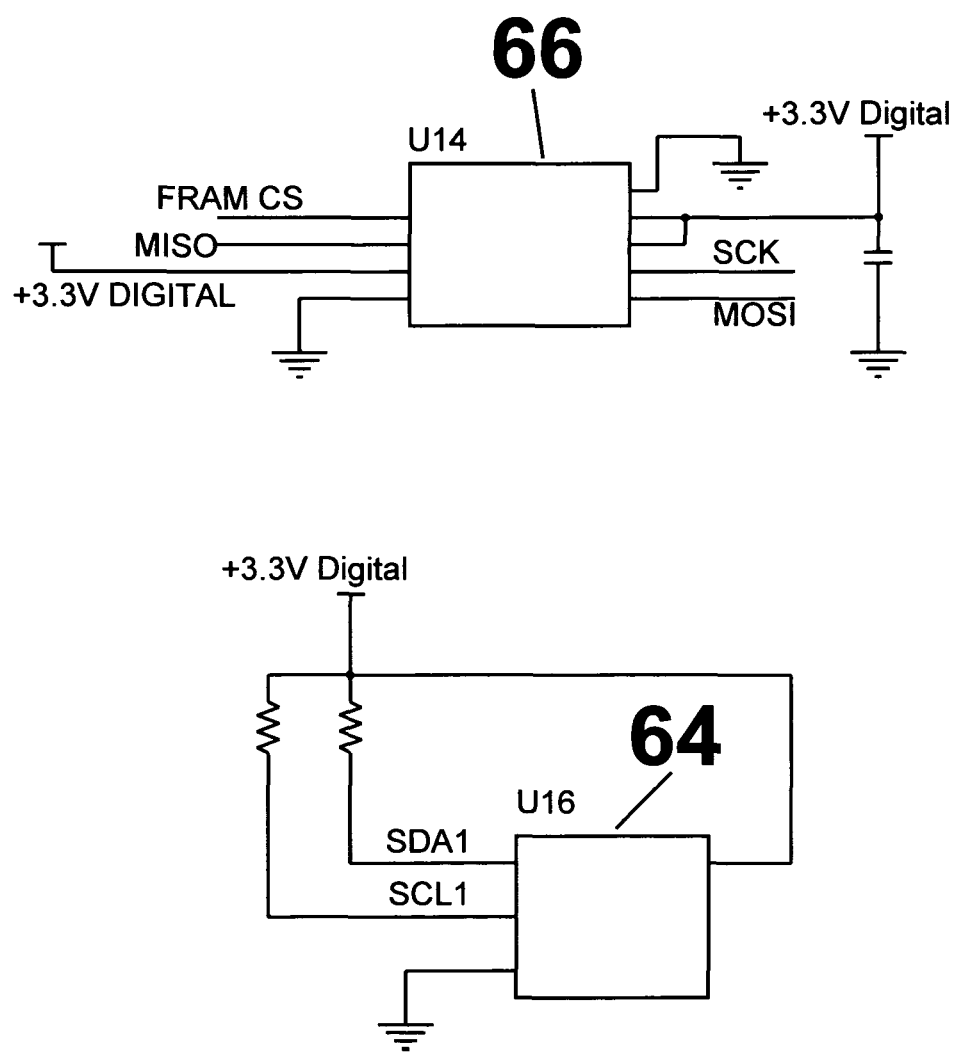
FIG. 4E is a schematic of the system non-volatile memory and temperature sensor for one embodiment of the invention.

Once zeroed, the device may be removed from the magnetically shielded enclosure. The unit is then placed into a test fixture which subjects the unit to a series of known magnetic field levels. The measurements are compared to the known reference values and correction coefficients are generated and stored in non-volatile memory 66 (FIG. 4E).

The analog to digital converter 114 (FIG. 4C) is configured and controlled by microcontroller 102 (FIG. 4D) via serial interface. The signals from the three axes are sequentially sampled by analog to digital converter 114 and then read into microcontroller 102 for processing on command. The analog to digital converter 114 features an internal temperature compensated voltage reference that can be accessed externally. The voltage reference is used externally by microcontroller 102 as a voltage reference for its internal multi-channel analog to digital converter.

In preferred embodiments of the device of the present invention the microcontroller 102 does not contain any non-volatile memory for data storage. In these embodiments one or more external non-volatile memory(s) are needed if data is to be stored. Non-volatile memory 66 may be used to store all system data which may include but is not limited to, model number, serial number, firmware version, hardware version, calibration data, logged data, measured magnetic field maximums and various system configuration settings.

Figure 4F:
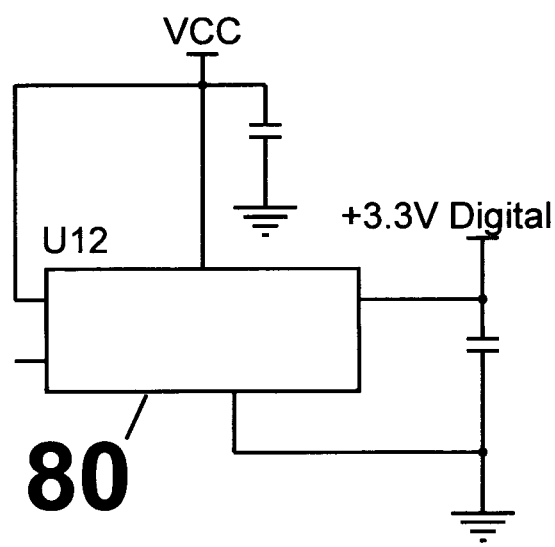
FIG. 4F is a schematic of the voltage regulator for the digital circuitry and also voltage dividers for voltage monitoring for one embodiment of the invention.
Figure 4F:
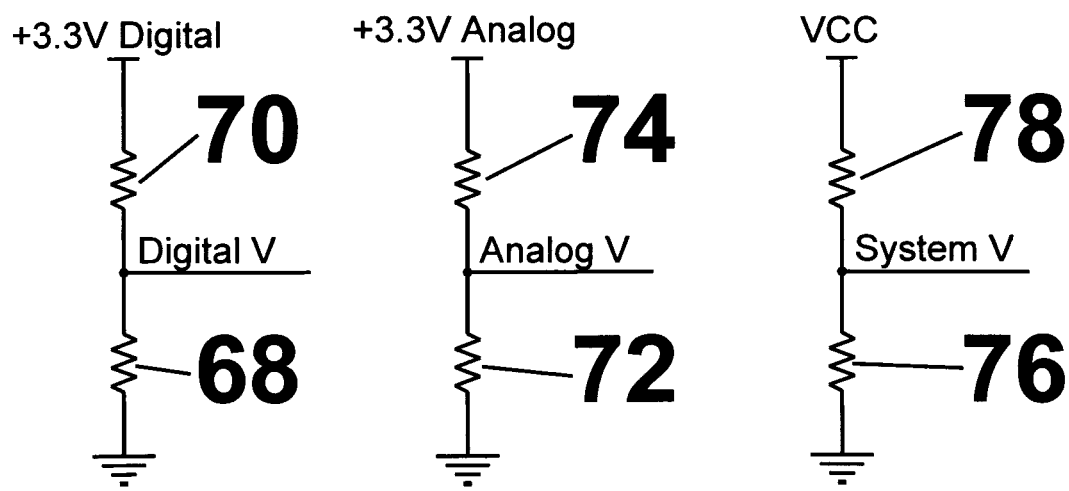
Figure 4G:
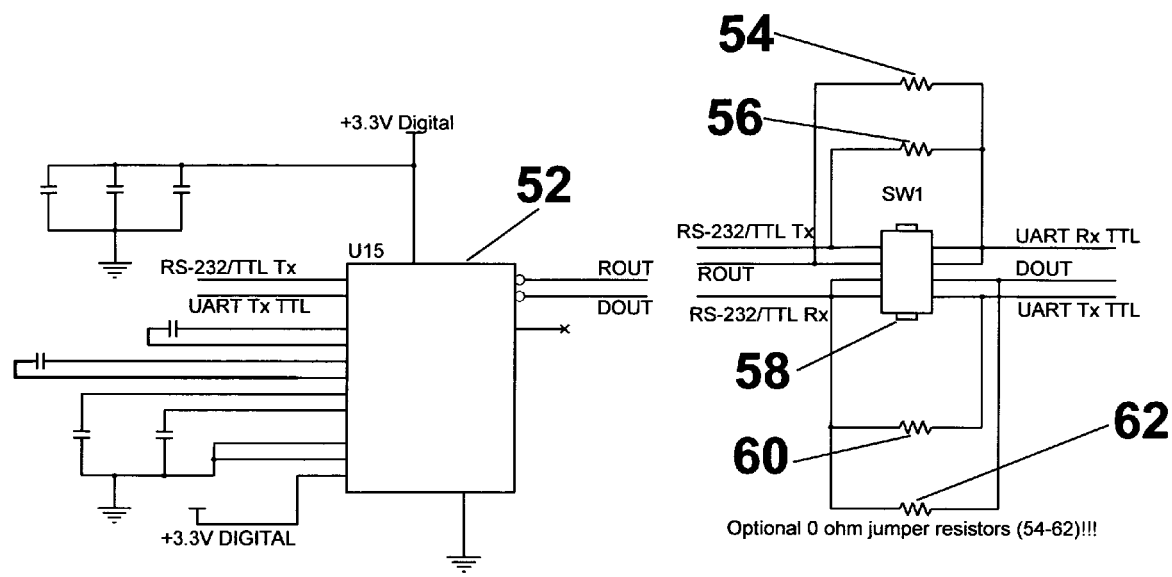
FIG. 4G is a schematic of the data input/output voltage level translator for one embodiment of the invention.

In preferred embodiments the devices of the present invention constantly monitor the system supply voltage, digital voltage supply rail and the analog voltage supply rail. Each of the three monitored voltages passes through a resistor voltage divider network, 70-76 to reduce each of the voltages to a level that does not exceed that of the analog to digital converter voltage reference (FIG. 4F). Three internal analog to digital converter channels of microcontroller 102 may be used for the voltage monitoring. The system supply voltage input is preferably from about 4 to about 12 V DC. The full scale system supply voltage that can be measured is about 15V DC. Both the analog and digital voltage rails, preferably about 3.3V each, are regulated by voltage regulators 80 (FIG. 4F and 110 FIG. 4B respectively. The full scale analog and digital voltage rail voltages that can be measured are about 4V DC. The purpose of the voltage monitoring is for built-in self-test (BIST).

In other embodiments of the present invention 5V components may be used, requiring 5V analog and digital voltage rails. This embodiment may require relatively more power to operate. Alternatively 1.8V electronic components, which have very low power requirements can be employed In a preferred embodiment the selected digital and mixed signal components used in the preferred embodiment are all low power 3.3V devices; therefore, the 4V to 12V system voltage is regulated to 3.3V for both the analog and digital voltage rails to power these components.

The devices of the present invention may also include a temperature sensor (64) for temperature compensation (FIG. 4E). In preferred embodiments of the devices of the present invention the temperature sensor has a range that can measure between about −55° C. to about 125° C. This range is selected for measuring the temperature in the environment of a unit designed to operate at a typical medical facility ambient temperatures. Other temperature sensors which can accommodate a broader temperature range for instruments meant to be used at high or low temperatures may also be used. Once the temperature data is acquired by microcontroller, it may be used to modify the magnetic readings accordingly.

Temperature compensation can be incorporated into the device of the present invention to increase the accuracy of the field level measurements especially when the device is to be used in an environment which significantly differs in temperature from the environment in which it was calibrated. For example, the output voltage at a given magnetic field level of most Hall devices decreases as temperature rises. The output of a temperature sensing device (thermistor, thermocouple or dedicated temperature sensing integrated circuit) could be used to compensate for the temperature coefficient of the output of the sensing elements (Hall devices in the invention as presently designed). This could be performed in the analog circuitry by altering the gain of the amplifier, or the control current level. Temperature compensation could also be performed mathematically by the microcontroller section of the invention by using temperature coefficient data for the sensing elements, whether typical empirically derived values or actual measured values. The temperature sensor may be digital and may be controlled and read by microcontroller 102.

The devices of the present invention can be designed to incorporate any of the various types of processors such as Complex instruction set computer (CISC), reduced instruction set computer (RISC), Harvard architecture, von Neumann architecture and also the Modified Harvard architecture. The preferred microcontroller has a small footprint, low pin count, ample program memory, low power consumption, integrated oscillator and rich set of peripherals.

The implementation of the circuitry for the devices of the present invention may be accomplished in various ways. For example the GaAs Hall effect sensors could also be InAs or InSb sensors or alternatively other magnetic senor types such as but not limited to, magneto-restive (MR/GMR), magneto-optical or coils may be used. Other physical parameters such as temperature, luminous intensity, sound pressure level, wind velocity, humidity, pH level, proximity, flow rate, force, current, voltage, resistance, position, pressure, turbidity, conductivity or chemical detection may also be measured and monitored with the use of other sensors on the input side of the device of the present invention. Any number of sensors may be employed depending on the number of axes of interest. If for example only one or two axes are of interest then one or two sensors can be utilized. The amplifier section of the devices could employ a multiplexing scheme to switch the individual sensor outputs to the amplifier rather than utilizing individual amplifiers for each axis. Filtering or signal conditioning circuits could be added to limit frequency response. Vector summation could be achieved by dedicated circuitry rather than mathematically analyzing sampled data. For sensor types requiring a control voltage or current, the three separate current supplies could be replaced with a single supply providing excitation to the sensors in a series fashion. Calibration could be accomplished by a strictly numeric means through use of calibration factors or adjustment of amplifier gain rather than adjustment of the sensor excitation level. Other communication schemes such as Ethernet or USB could be employed in addition to the preferred serial bus. The applications are not limited to the particular magnetic field levels, resolution or accuracy mentioned or only to use within medical equipment. Furthermore, the devices could be configured as a remote monitoring device powered over Ethernet (POE) and controllable via the Internet for application in any number of domestic, commercial or industrial locations.

A typical application in which the invention may be used is in the magnetic resonance imaging (MRI) room of a hospital. The invention may be embedded into a device such as a patient monitor which may contain costly components that can be permanently damaged by the strong magnetic fields emitted from the MRI machine. The invention will monitor the vector summation of the magnetic field the patient monitor device is exposed to while the MRI machine is in operation and transmit the information to the patient monitor. If the magnitude of the measured magnetic field is too high, the manufacturer of the patient monitor may use the information to warn the end-user that the equipment is too close to the energized MRI machine and may cause damage. The invention will also log, to non-volatile memory, the maximum magnitude of magnetic field the unit was exposed to during operation, which may be retrieved on command.

Communication and control with the devices of the present invention may be achieved by commercially available software package or language, for example but not limited to the variants of C, C++, BASIC, Fortran, LabView, TestPoint or HyperTerminal and a computer or controller which can send and receive serial communications or by other equipment with a serial port for communication. The communication may be at TTL type digital or bipolar voltage levels commonly associated with RS-232C interfaces. The default message terminator when sending a command to the unit is a carriage return (0x0D) and the default message terminator sent by the unit is line feed and carriage return (0x0D, 0x0A). Communication may be by direct wired connection or in conjunction with RF or optical transceiver modules. There are four user selectable baud rates available. Miscellaneous data such as model, serial number or firmware version may be retrieved by the user.

This type of communication and command set allows the end user to configure their own alarm thresholds or warnings and resultant action including a simple indication or equipment shutdown. The internal data logging function is also user configurable for various timing intervals and retrieval of vector sum or individual axis data. Control may be initiated through text based command strings or graphical interfaces such as buttons or check boxes, limited only by the host system's particular programming language or hardware capabilities. The data received from the unit may be displayed numerically, graphically or stored in external memory of the host device.

Communication may be achieved by use of a standard command set which may be expanded as future needs arise. Numeric commands are sent to the unit to change operating modes or to retrieve information back to the host. A command to clear the screen is included specifically for use with Microsoft HyperTerminal program. Other commands used for calibration are proprietary to the factory. This prevents the user from accidentally changing or corrupting the calibration of the unit. A standard user command set is described in FIG. 5.

We claim:
1. A method of calibrating a magnetic field monitor device comprising:
   a) placing the device in a magnetically shielded enclosure;
   b) zeroing signal conditioning circuitries of the device in an automated firmware controlled closed-loop operation; and
   c) transmitting commands from a microcontroller to a digital to analog converter to adjust offsets of X, Y, and Z channels until an analog signal output on the X, Y and Z channels is interpreted by an onboard analog to digital converter as being zero.

2. A magnetic field monitoring device comprising:
a) one or more voltage regulators;
b) one or more microcontrollers including means for zeroing signal conditioning circuitries of the device in an automated firmware controlled closed-loop operation, and means for adjusting offsets of X, Y and Z channels of the device and generating an analog signal output on the X, Y and Z channels ;
c) nonvolatile memory;
d) one or more analog to digital converters including means for receiving the analog signal output on the X, Y and Z channels from the one or more microcontrollers;
e) one or more Hall sensors;
f) one or more instrumentation amplifiers; and
g) one or more operational amplifiers.

3. The magnetic field monitoring device of claim 2 wherein the device is embedded in an instrument sensitive to magnetic fields.

4. The magnetic field monitoring device of claim 3 wherein the instrument is a medical instrument.

5. The magnetic field monitoring device of claim 2 wherein the device further comprises Integrated circuits to provide voltage level shifting to one or more communication input/output (IO) lines.

6. The magnetic field monitoring device of claim 2 wherein the device further comprises one or more digital temperature sensor(s).

7. A method of measuring a magnetic field using a three axis magnetic field monitoring device, comprising:
providing the device with three magnetic field sensors arranged to detect magnetic fields along three orthogonal (X, Y and Z) axis;
locating the device in the proximity of an apparatus for which exposure to a magnetic field is to be measured;
monitoring and logging the magnetic field said apparatus is exposed to along the three orthogonal axis;
determining a vector summation of at least a portion of the monitored and logged magnetic fields along the three orthogonal axis;
providing a physically perceptible output of the magnetic field vector summation; and further comprising device calibration steps of:
placing the device in a magnetically shielded enclosure;
zeroing signal conditioning circuitries of the device in an automated firmware controlled closed-loop operation; and
transmitting commands from a microcontroller to a digital to analog converter to adjust offsets of channels corresponding to the X, Y and Z axis until the analog signal output on the X, Y and Z channels is interpreted by an onboard analog to digital converter as being zero.

8. The method of claim 7, further comprising calibrating the device based on ambient temperature.

* * * * *